(12) United States Patent
Inoue

(10) Patent No.: US 6,465,850 B1
(45) Date of Patent: Oct. 15, 2002

(54) SEMICONDUCTOR DEVICE

(75) Inventor: Toshiaki Inoue, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/546,261

(22) Filed: Apr. 10, 2000

(30) Foreign Application Priority Data

Apr. 12, 1999 (JP) .......................................... 11-104060

(51) Int. Cl.7 ............................................... H01L 29/76
(52) U.S. Cl. ...................... 257/379; 257/401; 257/390; 257/287; 257/275
(58) Field of Search ................................ 257/288, 252, 257/390, 728, 401, 287, 275, 379; 333/164; 505/210

(56) References Cited

U.S. PATENT DOCUMENTS

| | | | |
|---|---|---|---|
| 4,471,330 A | * 9/1984 | Naster et al. | 333/164 |
| 4,543,535 A | * 9/1985 | Ayasli | 330/53 |
| 4,605,912 A | * 8/1986 | Naster et al. | 333/164 |
| 4,939,485 A | * 7/1990 | Eisenberg | 333/104 |
| 5,006,816 A | * 4/1991 | Koide | 330/253 |
| 5,345,194 A | * 9/1994 | Nagasako | 331/99 |
| 5,852,318 A | * 12/1998 | Chikamatsu et al. | 257/390 |

FOREIGN PATENT DOCUMENTS

| | | | |
|---|---|---|---|
| JP | 61-194865 | 8/1986 | ............ H01L/27/06 |
| JP | 62-033475 | 2/1987 | ............ H01L/29/80 |
| JP | 64-077178 | 3/1989 | ............ H01L/29/80 |
| JP | 402017669 | * 1/1990 | ................. 257/537 |
| JP | 3-036745 | 2/1991 | ............ H01L/21/66 |
| JP | 3-292004 | 12/1991 | ............. H01P/5/08 |
| JP | 4-116966 | 4/1992 | |
| JP | 9-46164 | 2/1997 | ........... H03H/9/145 |

* cited by examiner

Primary Examiner—Eddie Lee
Assistant Examiner—Eugene Lee
(74) Attorney, Agent, or Firm—Hayes Soloway P.C.

(57) ABSTRACT

A semiconductor device provided with a field effect transistor having a electrode pads for wire-bonding comprises a first electrode pad for wire-bonding directly connected with the field effect transistor, and a second electrode pad for wire-bonding connected with the field effect transistor via a resistor. According to the semiconductor device, a chip used in the field effect transistor can be used in different frequencies by changing bonding.

5 Claims, 2 Drawing Sheets

SEMICONDUCTOR DEVICE

FIELD OF THE INVENTION

The invention relates to a semiconductor device, and especially to a semiconductor device provided with a field effect transistor (FET, hereinafter) having electrode pads for wire-bonding. The invention is suitably applied to a semiconductor device provided with a FET for amplifying a high output power in a radio frequency (RF) band.

BACKGROUND OF THE INVENTION

Figure 1A:
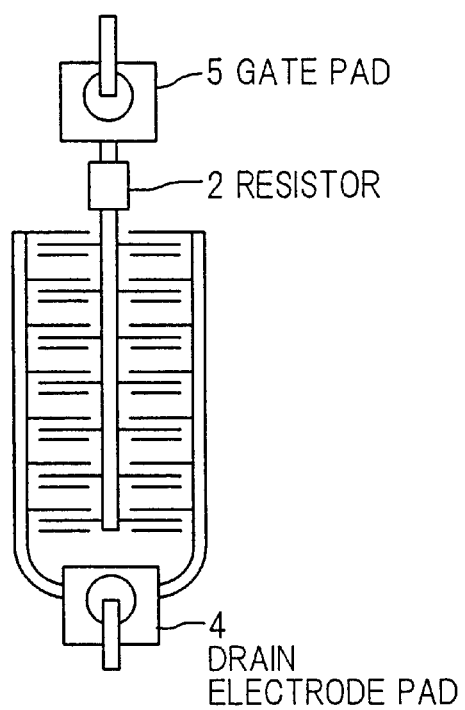
Figure 1B:
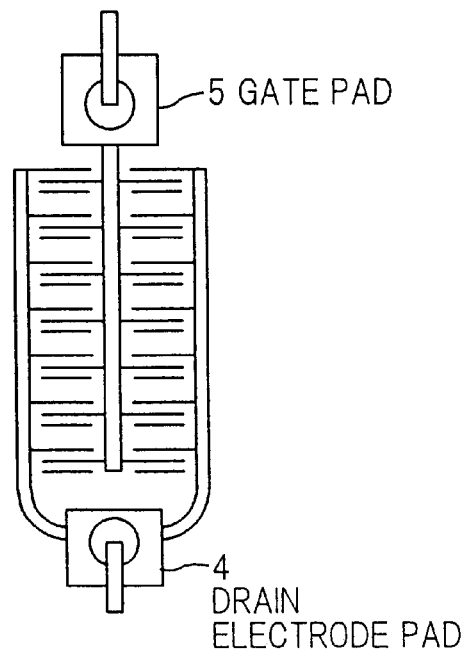

Hitherto, a chip used in a semiconductor device has been selected in accordance with a frequency in which the semiconductor device is used. FIG. 1A shows a wiring pattern of a conventional semiconductor device used in a lower frequency band, and a wire drawn out from a chip of a FET is connected with a gate pad 5 via a resistor 2 formed of highly resistive metal. FIG. 1B shows a wiring pattern of a conventional semiconductor device used in a RF band, and a wire drawn out from a chip is directly connected with a gate pad 5.

Although the semiconductor device according to the wiring pattern shown in FIG. 1A can be used without an alteration in case that it is used in the lower frequency band if it is used in the RF band, the RF characteristic of the semiconductor device is inferior to that of a semiconductor device having no series resistor.

On the other hand, although a semiconductor device according to the wiring pattern shown in FIG. 1B can be used without an alteration in the RF band, if the aforementioned semiconductor device is used in a lower frequency band, a sufficient isolation cannot be secured in case that GL (a linear gain) is high, and the semiconductor device becomes unstable. Although it is possible to reduce GL by power matching in accordance with RF matching, RF characteristic (especially, addition efficiency) is inevitably deteriorated.

SUMMARY OF THE INVENTION

Accordingly, it is an object of the invention to provide a semiconductor device which solves the aforementioned problems, enables chips of a single kind operate at different frequencies, and satisfies various requirements small number of products.

According to the feature of the invention, a semiconductor device provided with a field effect transistor having electrode pads for wire-bonding, comprises:

a first electrode pad for wire-bonding directly connected with the field effect transistor, and a second electrode pad for wire-bonding connected with the field effect transistor via a resistor.

According to the invention, high performance Si power MOSFETs with GL higher than 15 dB which are respectively provided with the same chips which can be used in different frequency bands without causing oscillations and deteriorations of RF characteristics by changing the positions of wire-bonding.

BRIEF DESCRIPTION OF THE APPENDED DRAWINGS

Figure 2A:
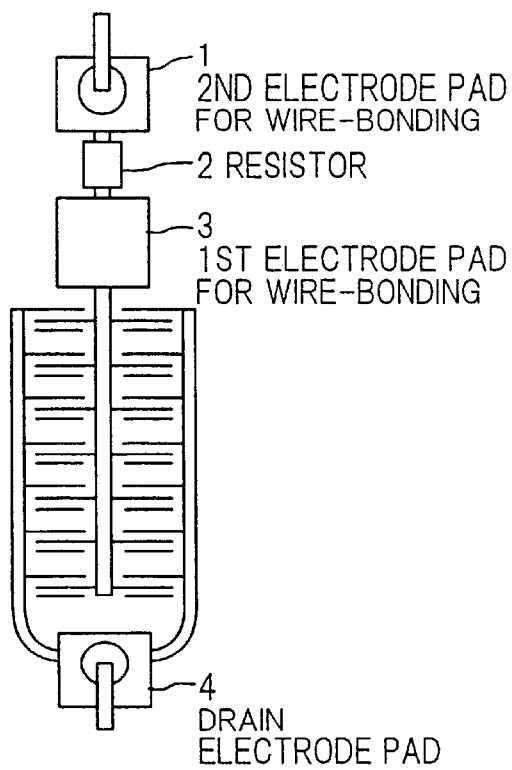
Figure 2B:
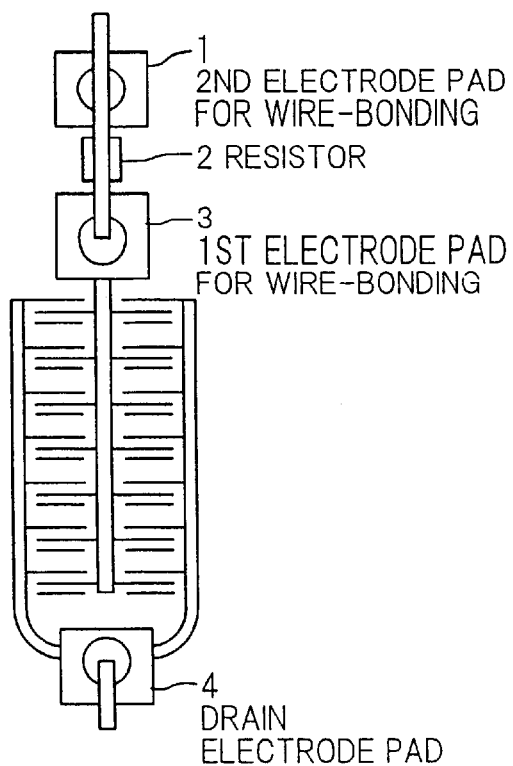

The invention will be explained in more detail in conjunction with appended drawings, wherein:

FIG. 1A shows a conventional semiconductor device to be used in a lower frequency band, FIG. 1B shows a conventional semiconductor device to be used in a RF band, FIG. 2A shows a semiconductor device according to the invention to be used in a lower frequency band, and FIG. 2B shows a semiconductor device according to the invention to be used in a RF band.

DESCRIPTION OF THE PREFERRED EMBODIMENTS

FIGS. 2A and 2B respectively show structures of semiconductor devices according to the invention. In the semiconductor device shown in FIG. 2A, a wire drawn out from a chip of a FET is connected with the second electrode pad for wire-bonding 1 via the first electrode pad for wire-bonding 3 and a resistor 2, wherein the electrode pad 1 is connected with an external wiring via a bonding wire, and 4 denotes a drain electrode pad. The resistor 2 is formed of WSi/polycrystalline Si for instance. As shown in FIG. 2B, a wire drawn out from the chip is connected with the first electrode pad for wire-bonding 3, which is connected with an external wiring via a bonding wire.

The FET shown FIG. 2A or 2B is a kind of a FET with a multi-finger structure, which is constituted of plural arrayed unit cells, wherein each unit cell comprises a drain, a gate and a source. In the unit cell array, the drains and the gates are alternately connected with electrode conductors to form a FET of a comb-shaped structure.

As mentioned above, the wiring pattern shown in FIG. 2A is suited for a case where the semiconductor device is used in a lower frequency band, and the same shown in FIG. 2B is suited for a case where the semiconductor device is used in a RF band.

In the aforementioned embodiments, since the same chips can be used through the different frequency bands and whether the series resistor is used or not can be determined by changing the bonding pad, the devices which can be used in the different frequency bands can be fabricated. Accordingly, the chips can be fabricated on the same condition through a bottom surface process to a mount process, and the semiconductor devices to be used in the different frequency bands can be produced only by changing a program for bonding.

As mentioned above, according to the invention, the semiconductor devices to be used in the different frequencies can be fabricated using the same chips. Accordingly, the chips can be produced on the same condition through a bottom surface process to a mount process, and the semiconductor devices to be used in the different frequencies can be provided only by changing a program for bonding.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A semiconductor device comprising a field effect transistor having a multi-finger structure, said field effect transistor comprising an array of unit cells, each said cell including a drain, a gate and a source, where the drains and gates are alternatively connected via respective drain and gate conductors to form a field effect transistor of a comb-shaped structure, said semiconductor device further comprising:

a first electrode pad selectively connected to said gate conductor; and a second electrode pad selectively connected to said gate conductor via a resistor;

wherein at least one of said first and second electrode pads being wire bonded to said gate conductor.

2. A semiconductor device according to claim 1, wherein said second electrode pad is series connected to said first electrode pad via said resistor.

3. A semiconductor device according to claim 2, wherein said resistor is formed of WSi/polycrystalline silicon.

4. A semiconductor device comprising a field effect transistor having a multi-finger structure, said field effect transistor comprising an array of unit cells, each said cell including a drain, a gate and a sources where the drains and gates are alternatively connected via respective drain and gate conductors to form a field effect transistor of a comb-shaped structure in which the gate electrodes connect to a common gate conductor within said cells, and the drain electrodes connect to a common drain electrode on the periphery of said cells; said semiconductor device further comprising:

a first electrode pad selectively connected to said gate conductor; and a second electrode pad selectively series connected to said gate conductor, wherein at least one of said first and second electrode pads being wire bonded to said gate conductor;

said second electrode pad series connected with said first electrode pad via a resistor.

5. A semiconductor device according to claim 4, wherein said resistor is formed of WSi/polycrystalline silicon.

* * * * *

UNITED STATES PATENT AND TRADEMARK OFFICE
CERTIFICATE OF CORRECTION

PATENT NO. : 6,465,850 B1
DATED : October 15, 2002
INVENTOR(S) : Inoue

It is certified that error appears in the above-identified patent and that said Letters Patent is hereby corrected as shown below:

Title page,
Item [57], ABSTRACT,
Line 2, delete "a"

Column 3,
Line 13, "sources" should read -- source --

Signed and Sealed this

Sixth Day of July, 2004

JON W. DUDAS
*Acting Director of the United States Patent and Trademark Office*